United States Patent
Straw

(10) Patent No.: US 9,216,475 B2
(45) Date of Patent: Dec. 22, 2015

(54) SYSTEM FOR PROTECTING LIGHT OPTICAL COMPONENTS DURING LASER ABLATION

(71) Applicant: FEI Company, Hillsboro, OR (US)

(72) Inventor: Marcus Straw, Portland, OR (US)

(73) Assignee: FEI Company, Hillsboro, OR (US)

( * ) Notice: Subject to any disclaimer, the term of this patent is extended or adjusted under 35 U.S.C. 154(b) by 240 days.

(21) Appl. No.: 13/851,344

(22) Filed: Mar. 27, 2013

(65) Prior Publication Data

US 2014/0291305 A1    Oct. 2, 2014

Related U.S. Application Data

(60) Provisional application No. 61/618,772, filed on Mar. 31, 2012.

(51) Int. Cl.
| | |
|---|---|
| B23K 26/12 | (2014.01) |
| B23K 26/16 | (2006.01) |
| B23K 26/36 | (2014.01) |
| B23K 26/06 | (2014.01) |
| B23K 28/02 | (2014.01) |

(Continued)

(52) U.S. Cl.
CPC .............. *B23K 26/0648* (2013.01); *B23K 15/08* (2013.01); *B23K 26/0624* (2015.10); *B23K 26/0635* (2013.01); *B23K 26/12* (2013.01); *B23K 26/122* (2013.01); *B23K 26/127* (2013.01); *B23K 26/1224* (2015.10); *B23K 26/16* (2013.01); *B23K 26/346* (2015.10); *B23K 26/36* (2013.01); *B23K 26/362* (2013.01); *B23K 26/365* (2013.01); *B23K 26/427* (2013.01); *B23K 26/706* (2015.10); *B23K 28/02* (2013.01); *H01J 37/226* (2013.01); *H01J 37/3056* (2013.01); *B23K 26/00* (2013.01)

(58) Field of Classification Search
CPC ........ B23K 26/00; B23K 26/12; B23K 26/16; B23K 26/36; B23K 28/02; B23K 26/346
USPC ............... 219/121.76, 121.86, 121.6, 121.85, 219/121.69, 121.19, 121.2; 156/345.39; 204/192.34; 216/94
See application file for complete search history.

(56) References Cited

U.S. PATENT DOCUMENTS

| | | | | |
|---|---|---|---|---|
| 5,358,806 | A | * 10/1994 | Haraichi et al. ................... | 430/5 |
| 5,407,146 | A | 4/1995 | Takahashi et al. | |

(Continued)

FOREIGN PATENT DOCUMENTS

| | | |
|---|---|---|
| FR | 1465435 | 1/1967 |
| JP | 57047594 | 3/1982 |

(Continued)

*Primary Examiner* — Samuel M Heinrich
(74) *Attorney, Agent, or Firm* — Scheinberg & Associates, PC; Michael O. Scheinberg; John E. Hillert

(57) ABSTRACT

A method and apparatus to perform laser ablation in the vicinity of a charged particle beam while simultaneously protecting the light optical components of the apparatus utilized to perform the ablation from being coated with debris resulting from the ablation process. According to preferred embodiments of the present invention, a protective transparent screen is used to shield the laser optical components. A preferred screen could be replaced or repositioned without breaking vacuum in the sample chamber and would not be particularly susceptible to undesirable charging effects.

20 Claims, 10 Drawing Sheets

(51) Int. Cl.
*B23K 15/08* (2006.01)
*B23K 26/30* (2014.01)
*H01J 37/22* (2006.01)
*H01J 37/305* (2006.01)
*B23K 26/00* (2014.01)

(56) References Cited

U.S. PATENT DOCUMENTS

| | | | | |
|---|---|---|---|---|
| 5,498,886 A | * | 3/1996 | Hsu | 257/213 |
| 5,810,930 A | * | 9/1998 | Eom et al. | 118/719 |
| 5,874,011 A | | 2/1999 | Ehrlich | |
| 5,912,939 A | * | 6/1999 | Hirsch | 378/43 |
| 6,437,285 B1 | | 8/2002 | Thomas et al. | |
| 7,302,043 B2 | | 11/2007 | Bloom et al. | |
| 8,168,961 B2 | | 5/2012 | Straw et al. | |
| 8,314,410 B2 | | 11/2012 | Straw et al. | |
| 8,524,139 B2 | | 9/2013 | Toth et al. | |
| 2011/0115129 A1 | | 5/2011 | Straw et al. | |
| 2011/0163068 A1 | | 7/2011 | Utlaut et al. | |
| 2011/0248164 A1 | | 10/2011 | Straw et al. | |
| 2012/0103945 A1 | | 5/2012 | Straw et al. | |

FOREIGN PATENT DOCUMENTS

| | | | |
|---|---|---|---|
| JP | H613101 | | 1/1986 |
| JP | H63109463 | | 5/1988 |
| JP | 404122689 A | * | 4/1992 |
| JP | 09029474 | | 2/1997 |
| JP | 2004090060 | | 3/2004 |

* cited by examiner

SYSTEM FOR PROTECTING LIGHT OPTICAL COMPONENTS DURING LASER ABLATION

This Application claims priority from U.S. Provisional Application No. 61/618,772, filed Mar. 31, 2012, which is hereby incorporated by reference.

TECHNICAL FIELD OF THE INVENTION

The present invention relates to protection of light optical components when laser ablation is performed in the vicinity of a charged particle beam.

BACKGROUND OF THE INVENTION

Charged particle beam systems are used in a variety of applications, including the manufacturing, repair, and inspection of miniature devices, such as integrated circuits, magnetic recording heads, and photolithography masks. Charged particle beams include ion beams and electron beams.

Ions in a focused beam typically have sufficient momentum to micromachine by physically ejecting material from a surface. Because electrons are much lighter than ions, electron beams are typically limited to removing material by inducing a chemical reaction between an etchant vapor and the substrate. Both ion beams and electron beams can be used to image a surface at a greater magnification and higher resolution than can be achieved by the best optical microscopes.

Ion beam systems using gallium liquid metal ion sources (LMIS) are widely used in manufacturing operations because of their ability to image, mill, deposit, and analyze with great precision. Ion columns in focused ion beam (FIB) systems using gallium LMIS, for example, can provide five to seven nanometers of lateral resolution. Because ion beams tend to damage sample surfaces even when used to image, ion beam columns are often combined with electron beam columns in dual beam systems. Such systems often include a scanning electron microscope (SEM) that can provide a high-resolution image with minimal damage to the target, and an ion beam system, such as a focused or shaped beam system, that can be used to alter workpieces and to form images. Dual beam systems including an LMIS FIB and an electron beam are well known. For example, such systems include the Quanta 3D FEG™ System, available from FEI Company of Hillsboro, Oreg., the assignee of the present invention. The ion beam can be used, for example, to cut a trench in an integrated circuit, and then the electron beam can be used to form an image of the exposed trench wall.

Unfortunately, high-precision milling or sample removal often requires some tradeoffs. The processing rate of the LMIS FIB is limited by the current in the beam. As the current is increased, it is harder to focus the beam into a small spot. Lower beam currents allow higher resolution, but result in lower milling rates and hence longer processing times in production applications and in laboratories. As the processing rate is increased by increasing the beam current, the processing precision is decreased.

Further, even at higher beam currents, focused ion beam milling may still be unacceptably slow for some micromachining applications. Other techniques, such as machining with a femtosecond laser can also be used for faster material removal but the resolution of these techniques is much lower than a typical LMIS FIB system. Lasers are typically capable of supplying energy to a substrate at a much higher rate than charged particle beams, and so lasers typically have much higher material removal rates (typically up to $7 \times 10^6$ μm3/s for a 1 Watt laser operating at al kHz laser pulse repetition rate) than charged particle beams (typically 0.1 to 3.0 μm3/s for a gallium LMIS FIB). Laser systems use several different mechanisms for micromachining, including laser ablation, in which energy supplied rapidly to a small volume causes atoms to be explosively expelled from the substrate. All such methods for rapid removal of material from a substrate using a laser beam will be collectively referred to herein as laser beam machining.

FIG. 1 is a schematic illustration 10 of a prior art laser ablating a surface. When a high power pulsed laser 12 producing laser beam 13 is focused onto a target material 14 supported by a stage 15 and the laser fluence exceeds the ablation threshold value for the material, chemical bonds in the target material are broken and the material is fractured into energetic fragments, typically a mixture of neutral atoms, molecules, and ions, creating a plasma plume 16 above the material surface. Since the material leaves the reaction zone as an energetic plasma, gas, and solid debris mixture, the ablation process resembles explosive evaporation of the material that propels material fragments 18 up and away from the point where the laser beam 13 is focused.

As compared to charged particle beam processing, laser ablation is capable of removing a relatively massive amount of material very quickly, with material removal rates more than 106× faster than a Ga LMIS FIB. The wavelength of light in the laser beam, however, is much larger than the wavelength of the charged particles in the charged particle beams. Because the size to which a beam can be focused is, in part, limited by the beam wavelength, the minimum spot size of a laser beam is typically larger than the minimum spot size of a charged particle beam. Thus, while a charged particle beam typically has greater resolution than a laser beam and can micromachine extremely small structures, the beam current is limited and the micromachining operation can be unacceptably slow. Laser micromachining, on the other hand, is generally much faster, but has poorer resolution due to diffraction.

Unfortunately, laser ablation, because of the large volume of debris produced, can tend to result in the gradual coating of the laser objective lens with debris, which ultimately degrades the performance of the laser. For laser ablation performed at atmosphere, a gas is typically blown across the surface to keep the debris away from the lens. Also, replaceable glass cover slips are sometimes used to cover the lens. Neither of these techniques can be easily used in a combined charged particle beam/laser system, however. The use of a gas is not practical because the sample chamber must be under vacuum for charged particle beam operation. Also, the use of glass covers is impractical; both because it requires venting the sample chamber to atmosphere to replace the covers and also because glass suffers from a very undesirable charging effect that will degrade the operation of the charged particle beam, especially for imaging purposes.

What is needed is a method and apparatus for protecting the laser optics from the build-up of debris during laser ablation in a charged particle system and preventing the resulting gradual degradation of the laser beam intensity.

SUMMARY OF THE INVENTION

An object of the invention is to provide a method and apparatus for performing laser ablation within a vacuum chamber in a charged particle beam system while simultaneously protecting the light optical components of the apparatus utilized to focus the laser from being coated with debris resulting from the ablation process. According to preferred embodiments of the present invention, a protective transparent screen is used to shield the laser optical components. A preferred screen could be replaced or repositioned without breaking vacuum in the sample chamber and would not be particularly susceptible to undesirable charging effects.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

Figure 1:
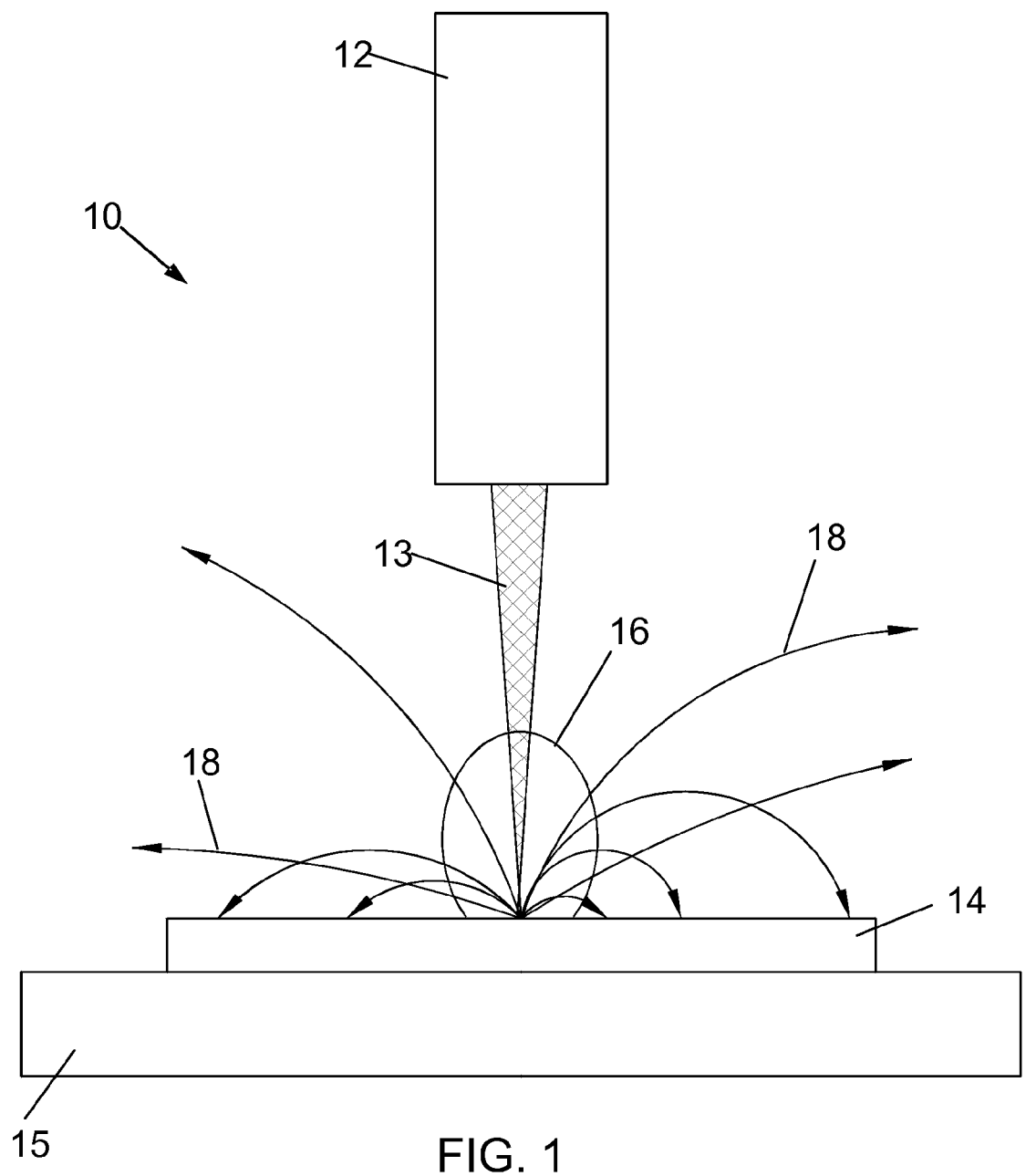
FIG. 1 is a schematic illustration of a prior art laser ablating a surface.

The accompanying drawings are intended to aid in understanding the present invention and, unless otherwise indicated, are not drawn to scale. In the drawings, each identical or nearly identical component that is illustrated in various figures is represented by a like numeral. For purposes of clarity, not every component may be labeled in every drawing.

DETAILED DESCRIPTION OF PREFERRED EMBODIMENTS

Applicants have discovered that the use of laser ablation within a vacuum chamber involves difficulties with debris buildup on the laser optics that are not seen in atmospheric laser ablation. Not only are the common methods for mitigating debris buildup not practical for ablation formed inside a vacuum chamber, as discussed above, but the problem is actually greater for ablation performed in a vacuum because debris will actually travel farther since it is not slowed by collisions with gas molecules in the atmosphere.

Preferred embodiments of the present invention thus provide a protective transparent screen that can be used to shield the laser optical components during laser ablation. Preferred embodiments should be easily replaced or repositionable without breaking vacuum in the sample chamber.

Figure 2:
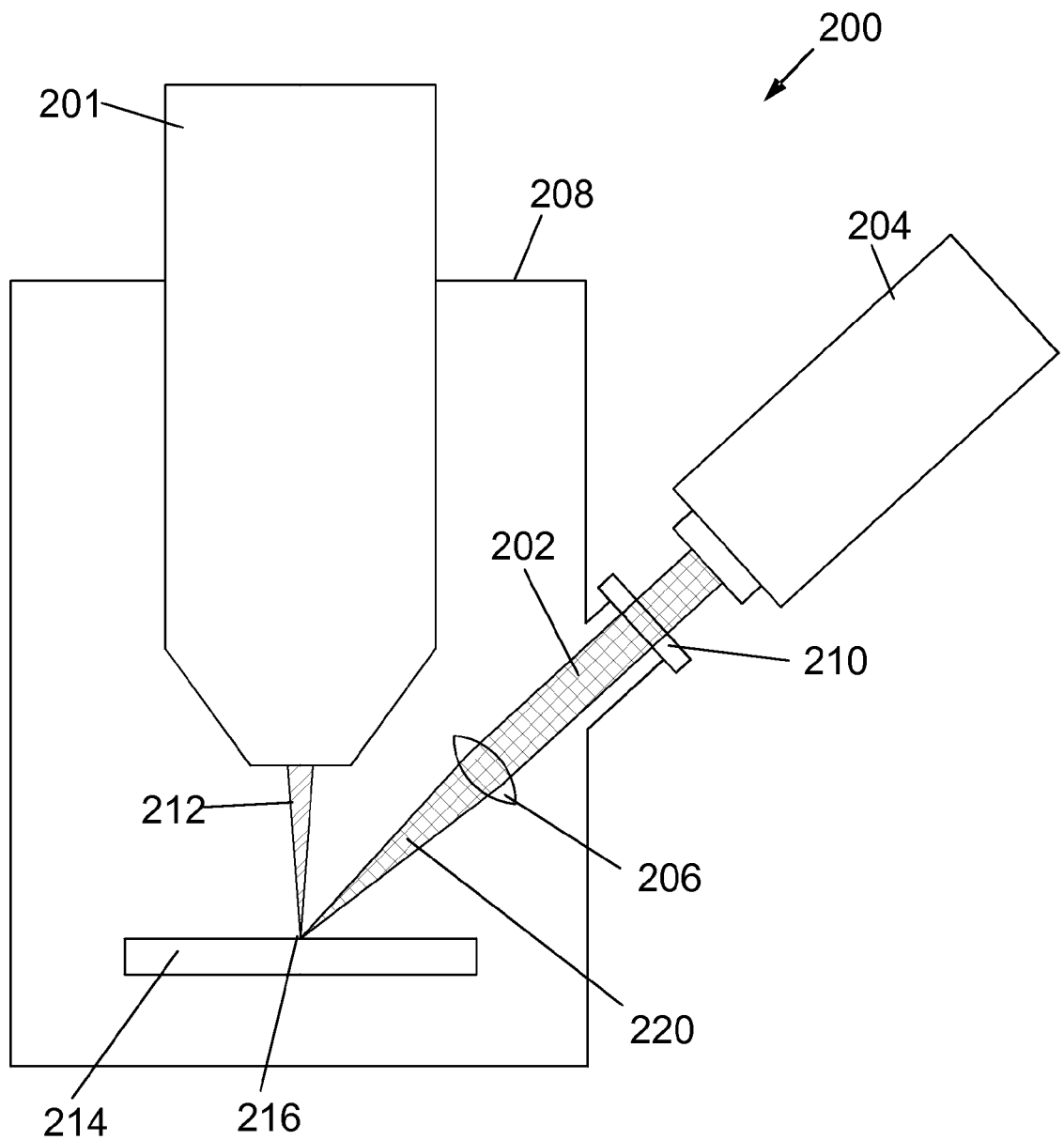
FIG. 2 is a schematic illustration of a combination SEM and laser according a preferred embodiment of the present invention.

FIG. 2 shows a dual beam system having a combination charged particle beam column 201 and laser 204. Such a dual beam system is described in U.S. Pat. App. No. 2011/0248164 by Marcus Straw et al., for "Combination Laser and Charged Particle Beam System," which is assigned to the assignee of the present application, and which is hereby incorporated by reference. As shown in the schematic drawing of FIG. 2, the laser beam 202 from laser 204 is focused by lens 206 located inside the vacuum chamber 208 into a converging laser beam 220. The laser beam 202 enters the chamber through a window 210. In the embodiment of FIG. 2, a single lens 206 or group of lenses (not shown) located adjacent to the charged particle beam 212 is used to focus the laser beam 220 such that it is either coincident and confocal with, or adjacent to, the charged particle beam 212 (produced by charged particle beam focusing column 201) as it impacts the sample 214 at location 216.

Figure 3A:
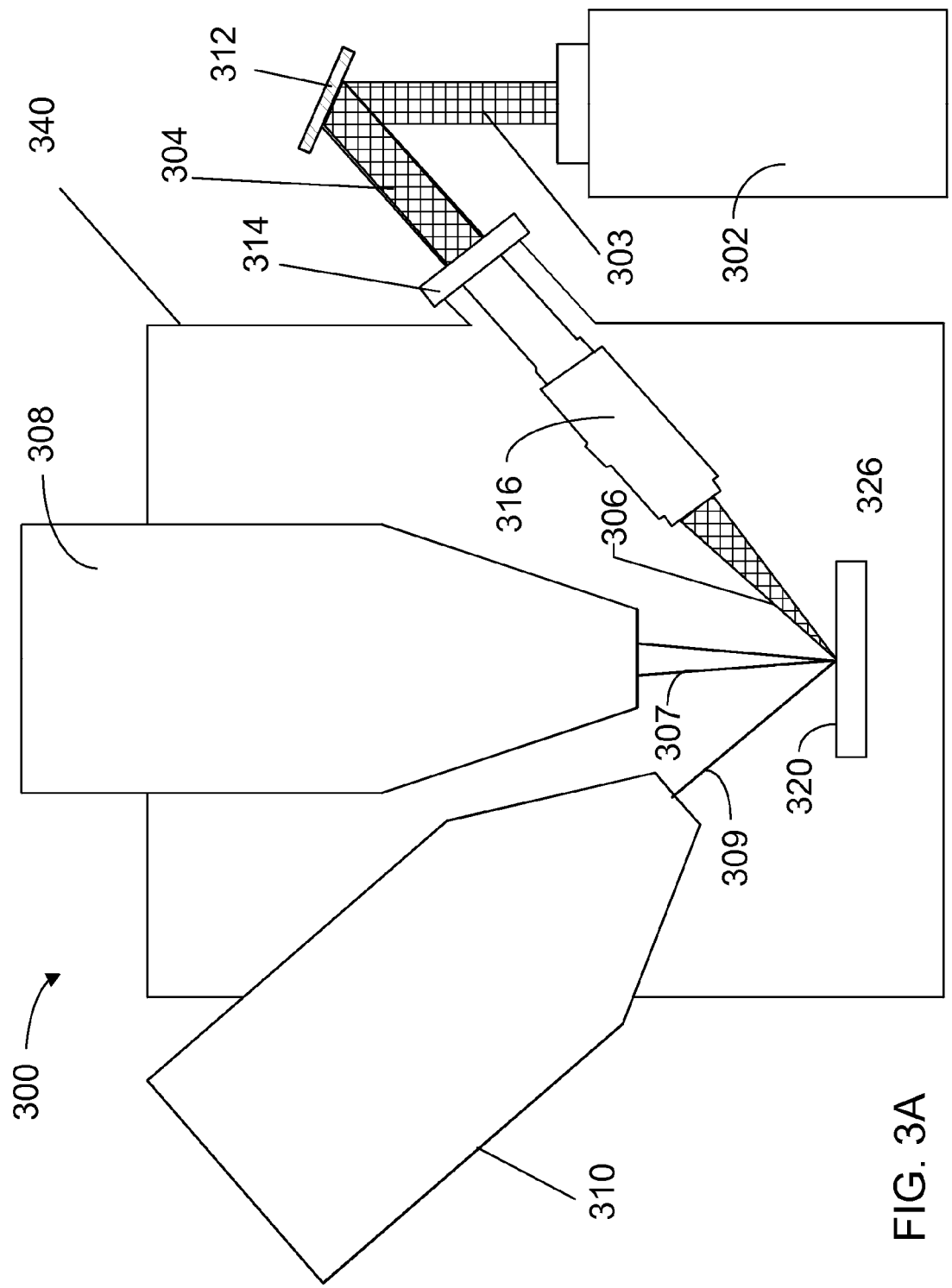
FIG. 3A is a schematic illustration of a combination dual beam FIB/SEM with a confocal laser.
Figure 3B:
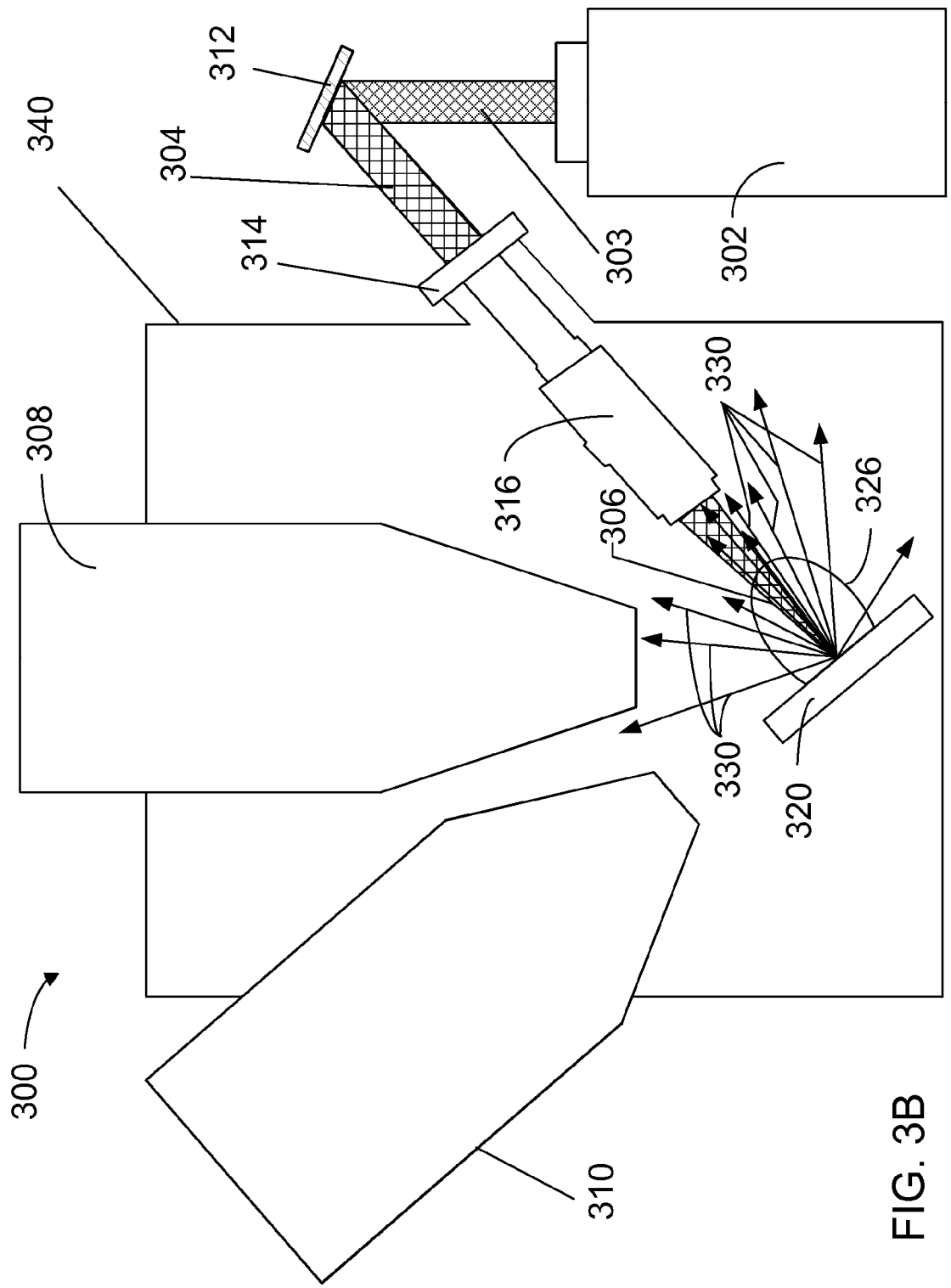
FIG. 3B shows the system of FIG. 3A with the sample tilted to be normal to the laser and with the laser ablating the sample surface.

FIGS. 3A and 3B show a system 300 that combines a focused laser beam 306 (produced by a laser 302) for rapid material removal with a focused ion beam 307 (produced by a FIB column 308) for further material processing and an electron beam 309 (produced by a SEM column 310) for monitoring the material removal process. Such a system is also described in U.S. Pat. App. No. 2011/0248164. A laser 302 directs a laser beam 303 towards a minor 312, which reflects the laser beam 303 to form reflected beam 304 directed through transparent window 314 in vacuum chamber 340. By "transparent" it is meant that the window is transparent to wavelengths of the particular type of laser being used. A lens 316 focuses the reflected laser beam 304 (which may be substantially parallel) into a focused laser beam 306 with a focal point at or near to the surface of a sample 320, which as shown in FIG. 3B is tilted so that the sample surface is normal to the focused laser beam 306.

Mirror 312 (or a similar reflecting element) can also be used to adjust the position of the focused laser beam 306 on the sample 320. Focused laser beam 306 is preferably capable of being operated at a fluence greater than the ablation threshold of the material in sample 320 being machined. Typically a short, nanosecond to femtosecond, pulsed laser beam is used to ablate substrate material, although other types of lasers can also be used.

The ablation threshold is an intrinsic property of the substrate material, and skilled persons can readily determine empirically or from the literature the ablation threshold for various materials. A silicon substrate, for example, has a single pulse ablation threshold of about 170 $mJ/cm^2$, and so the laser fluence should preferably be just above this value for micromachining silicon in accordance with preferred embodiments of the present invention. A laser beam suitable for rapid material ablation might have energy in the range of 50 nJ to 1 mJ, and a fluence in the range of 0.1 J/cm$^2$ to 100 J/cm$^2$.

During operation of the laser, a mixture of neutral atoms, molecules, electrons, and ions, exits the surface of sample 320 due to the impact of focused laser beam 306 creating a plasma plume 326 above the sample surface 320. Since the material leaves the reaction zone as a mixture of energetic plasma, gas, and solid debris, the ablation process resembles explosive evaporation of the material and propels material fragments up and away from the point where the focused laser beam 306 is focused. This sudden generation of large numbers of electrons and ions (the plasma plume) tends to scatter debris in all directions around the focus point of the laser. Because the sample chamber is under vacuum (for example so that one or both of the charged particle beams can be used to monitor the ablation process) the ejected debris will travel further than would be the case at higher pressures where more gas molecules are present for slow down the debris. As shown by arrows 330 some percentage of the ejected debris will wind up being deposited on the laser-focusing lens 316. The distribution of the debris has a strong normal component, which means when the laser is used as shown in FIG. 3B (with the beam normal to the surface) a larger percentage of the debris will be directed at the laser focusing lens 316. As the amount of debris on the lens gradually increases, the performance of the laser will be degraded. Eventually enough of the laser light will be blocked so that the laser will no longer properly ablate the sample surface.

The actual percentage of laser transmission required will vary for a given application. As used herein, the term "occluded" will be used to describe the lens (or the combination of lens and protective screening as described below) when the amount of transmitted laser light is so degraded by the buildup of debris that it is not sufficient for a particular application. The term "non-occluded) will be used to describe the lens (or the combination of lens and protective screening as described below) that is either completely clear of any build-up of debris or where the build-up is small enough that the amount of transmitted laser light is sufficient for the particular application.

Figure 3C:
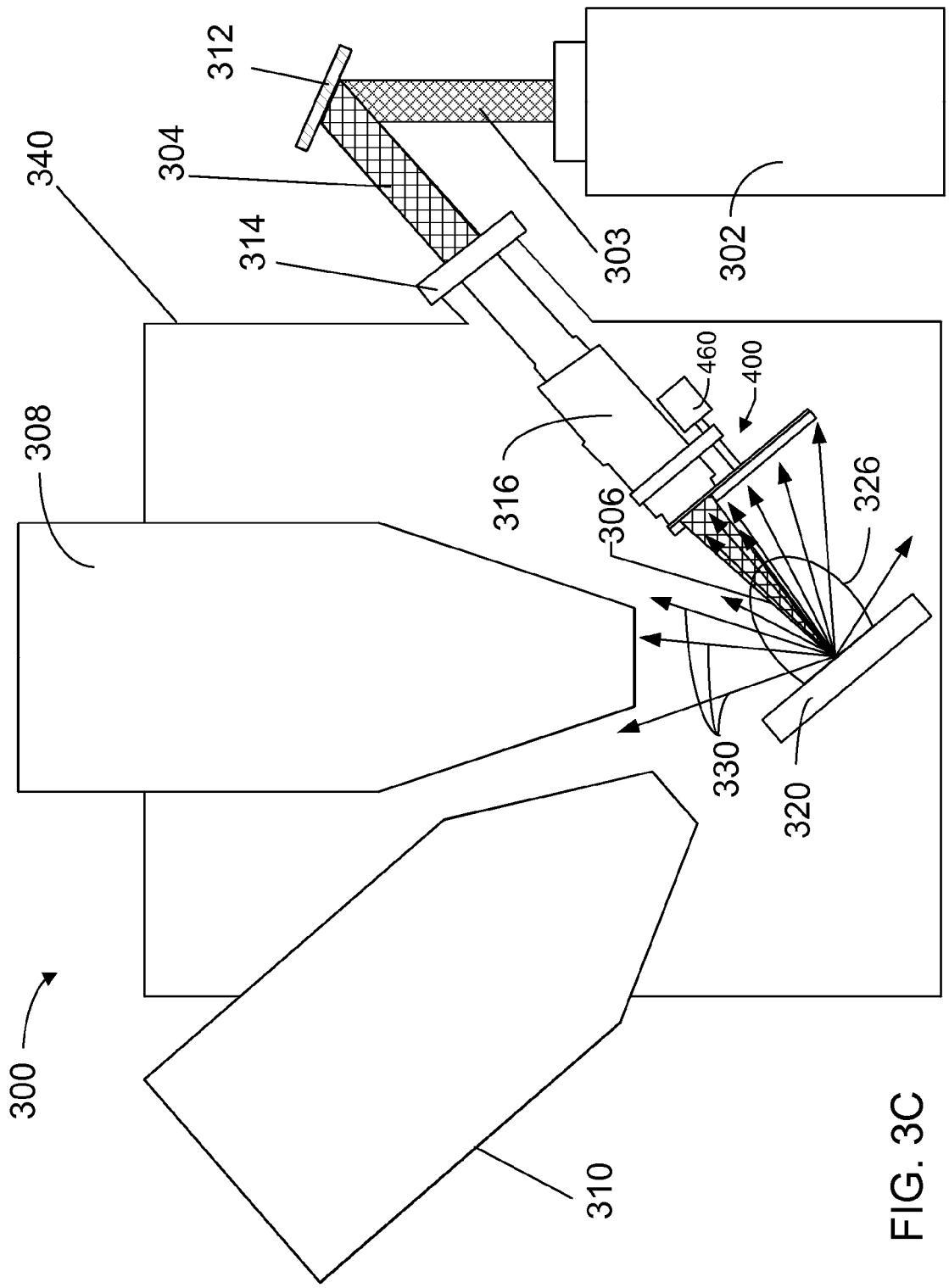
FIG. 3C shows the system of FIG. 3A including a protective screen assembly according to a preferred embodiment of the present invention.
Figure 4A:
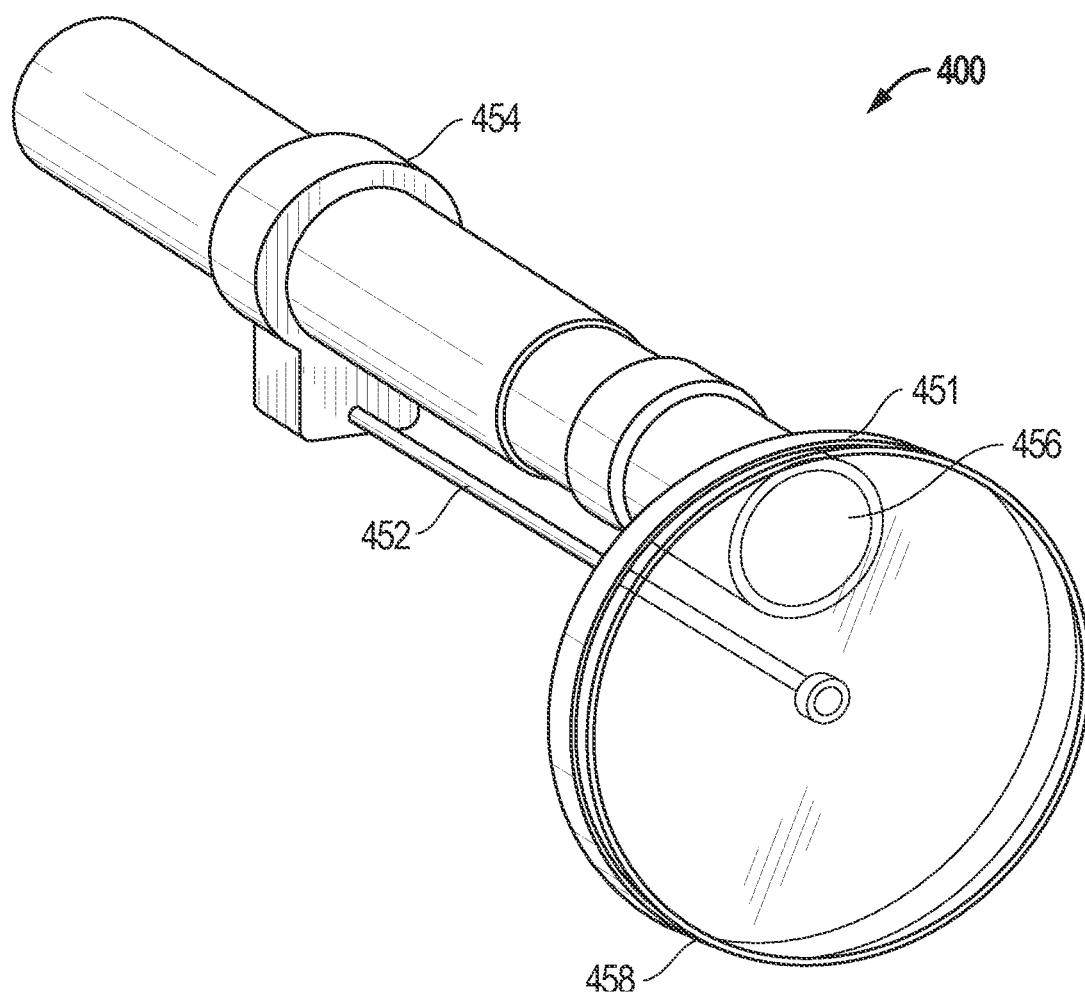
FIG. 4A is an expanded view of one preferred embodiment of the invention in which the lens is protected by a rotatable transparent screen.
Figure 4B:
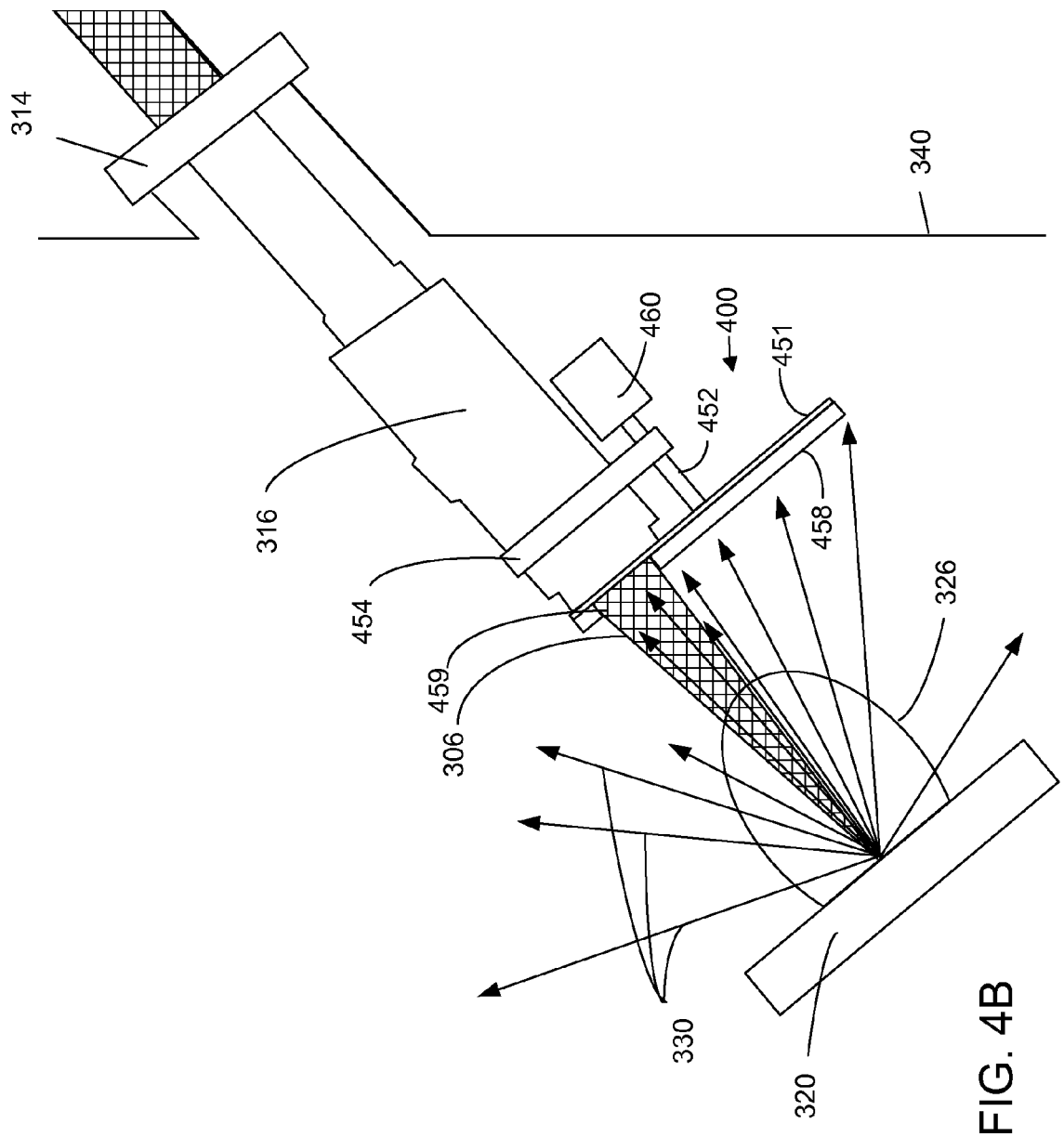
FIG. 4B is a close-up view of a protective screen assembly installed on a laser lens assembly according to a preferred embodiment of the present invention.

FIG. 3C shows the system of FIGS. 3A and 3B including a protective screen assembly according to a preferred embodiment of the present invention. FIG. 4 shows a larger view of a preferred embodiment of a protective screen assembly 400 that can be used to protect the laser lens from debris buildup. FIG. 4B is a close-up view of a protective screen assembly installed on a laser lens assembly according to a preferred embodiment of the present invention. In the embodiments of FIGS. 3C, 4A, and 4B, transparent screen 451 can be formed from a typical optical flat, which is an optical-grade disc of quartz or some other transparent material polished to be extremely flat on one or both sides and used with a monochromatic light to determine the flatness of other optical surfaces by interference.

Applicants have also discovered, however, that the use of transparent insulating material—like the glass covers commonly used for laser ablation at atmosphere—cause problems when used in a charged particle beam system. Glass, or other insulating materials, tends to build up a charge during operation of the charged particle beam system. Charging is the result of either secondary or back-scattered electrons ejected from the sample during electron or ion beam irradiation or photoelectrons ejected from the sample during laser ablation. When these charged particles land on a surface made of an insulating material such as glass, they become immobile (i.e. they are not conducted away as they would be on a surface made of a conducting material, such as a metal). Over time, as more and more electrons collect on the surface, a large electric field develops. This field interacts with the primary charged particle beam, distorting its shape and displacing it on the sample, eventually degrading the system's performance.

Build-up of charge on the surface of the lens used to focus the laser beam is particularly problematic in a charged particle beam system because of the desirability of using high numerical aperture lenses that allow for a long working distance. Because space is at such a premium inside a charged particle beam vacuum chamber, it is highly desirable to use a lens to focus the laser beam that can be positioned as far back as possible from the sample and yet still adequately resolve the laser beam. Such lenses tend to have a relatively large glass lens surface as compared to other laser focusing lenses. This, of course, results in a much larger surface area having low conductivity on which charging can occur. According to preferred embodiments of the present invention, the side of the transparent screen facing the charged particle beam can be coated with a transparent conductor such as indium tin oxide (ITO) or fluorine doped tin oxide (FTO) in order to counteract this charging effect. In other preferred embodiments of the present invention, the transparent screen can be completely formed from a transparent conductor material such as graphene.

In the assembly of FIG. 4A, transparent screen 451 is attached to a rod 452 such that the transparent screen is removable, either with or without the rod. Referring also to FIG. 4B, the rod 452 is preferably supported by a bracket 454 also attached to the lens assembly, and is operated by a motor 460 that can be used to rotate rod 452, in turn rotating the transparent screen 451. A fixed (i.e. non-rotating) shield 458 with a window having the dimensions of the objective 456, (shown here as semitransparent for clarity) can be located on top of the window, effectively masking the transparent screen everywhere except within opening 459, the region of the transparent screen through which the beam passes. Shield 458 can be formed, for example, from a metal such as stainless steel, or from other suitable materials such as conductive polymers. Debris ejected during ablation will thus strike both the shield 458 and the portion of the transparent screen exposed by opening 459. This preserves the transparency of the transparent screen everywhere except the area where the beam is currently passing.

During laser ablation, the transparent screen will increasingly become coated by ablated material. As the debris coating gets thicker, the laser power delivered to the sample will decrease. In a preferred embodiment, the laser power can be periodically measured as the sample is milled. When the power of the laser beam falls below a predetermined threshold, the transparent screen can be rotated so that the lens opening is covered by a new uncoated region of the transparent screen.

Figure 5:
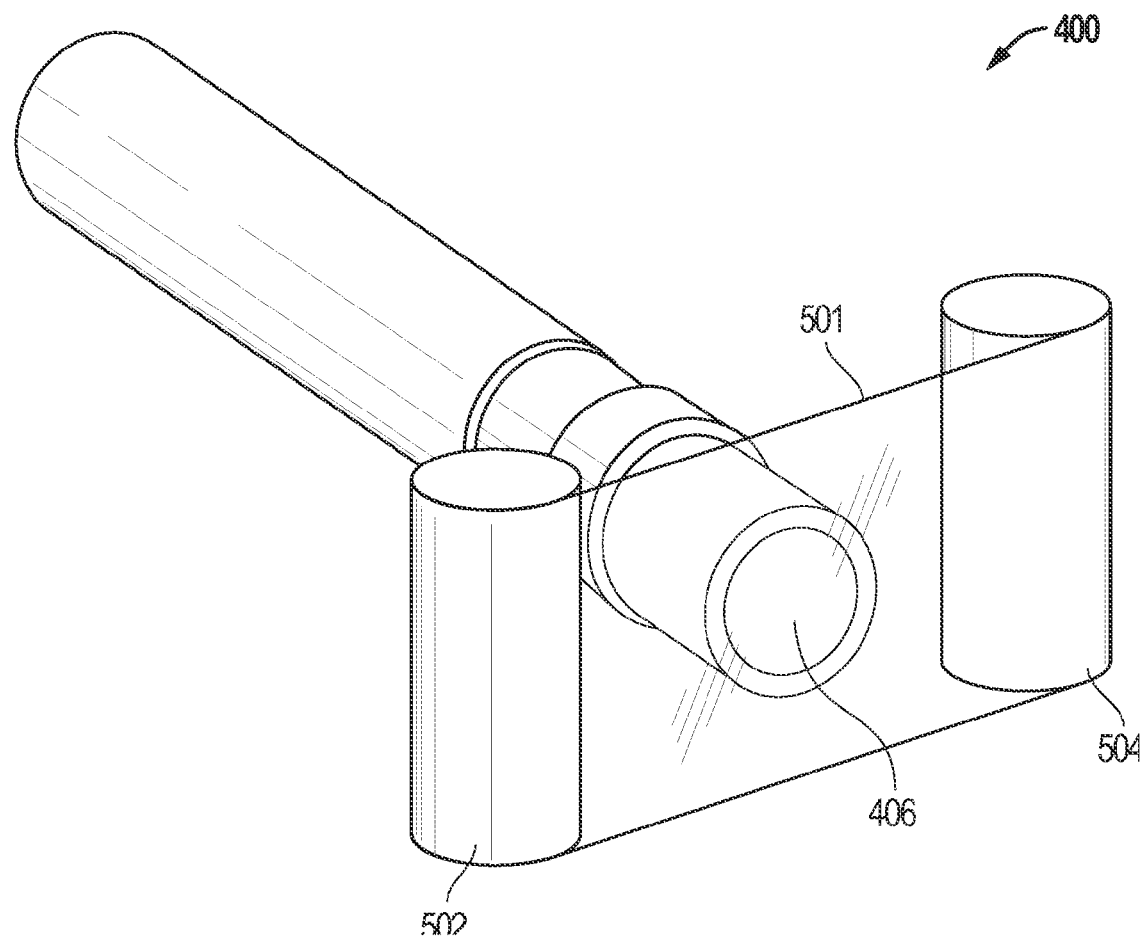
FIG. 5 is an expanded view of another embodiment of the invention in which a transparent conducting material is scrolled across the face of the laser objective lens.

Another embodiment of the invention is illustrated in FIG. 5. Rather than using an optical flat to protect the objective as discussed above, a transparent cover 501 comprising a transparent conducting film can be scrolled across the face of the objective using, for example, a motorized roller system similar to that found in camera film winding systems. Suitable transparent conducting films could include graphene, doped zinc oxide, or a polymer based film such as Poly (3,4-ethylenedioxythiophene) (PEDOT), PEDOT:Polystrene sulfonate (PEDOT:PSS), or Poly 4,4-diocytylcyclopentadithione. A roll of transparent conducting film can be stretched from one cylinder 502 to another cylinder 504. As the power of the beam falls below a predetermined threshold, non-occluded film is unwound from cylinder 502 and collected in cylinder 504, preferably by way of a motorized assembly operated without opening the vacuum chamber. No metal shield is required as cylinder 502 prevents the film from being coated during normal use because the unrolled film remains inside the cylinder where it is not exposed to the ablation debris. The entire assembly consisting of cylinder 502, cylinder 504, and the film is preferably easily replaceable when all of the film has been used.

Figure 6:
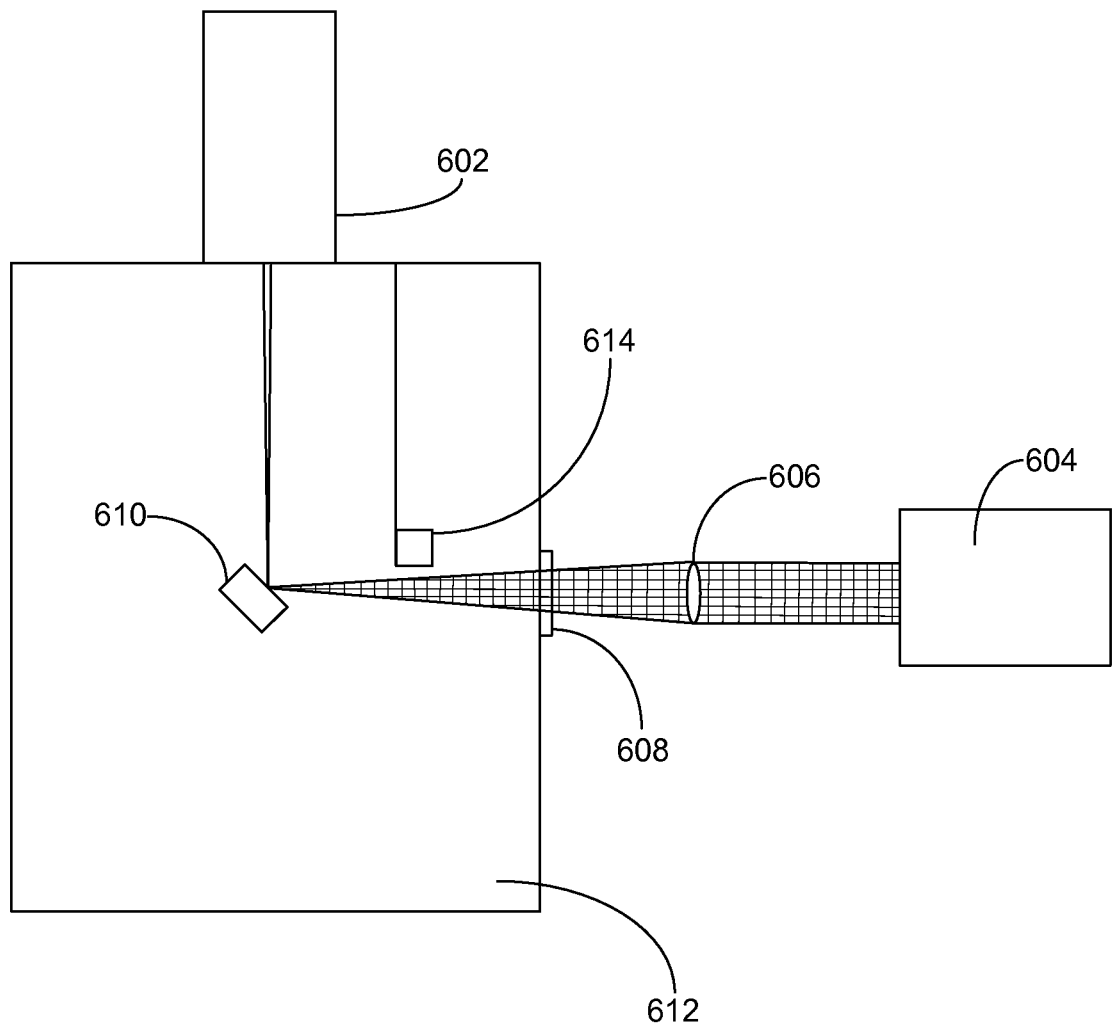
FIG. 6 is a schematic view of one preferred embodiment of the invention in which charged particles are generated, collimated, and enter the sample chamber to strike the sample at a close vicinity to the laser ablating the sample.

Yet another embodiment of the invention is illustrated in FIG. 6. Charged particles are generated and collimated by the charged particle beam generation system 602 and enter the sample chamber 612 to strike the sample 610. A laser beam is generated by a laser oscillator or amplifier 604 and focused by the focusing optics 606. The laser beam passes through the protective transparent conductive window 608 to strike the sample 610 in the sample chamber 612. As also described below with respect to FIG. 7, a laser detector 614 can be placed in the sample chamber and periodically swung into position to measure the power of the incoming laser beam being generated. The protective conductive window 608 is replaceable. In some preferred embodiments, window 608 is also slideable similar to the embodiments described above or can be replaced from outside the vacuum chamber without losing vacuum.

Figure 7:
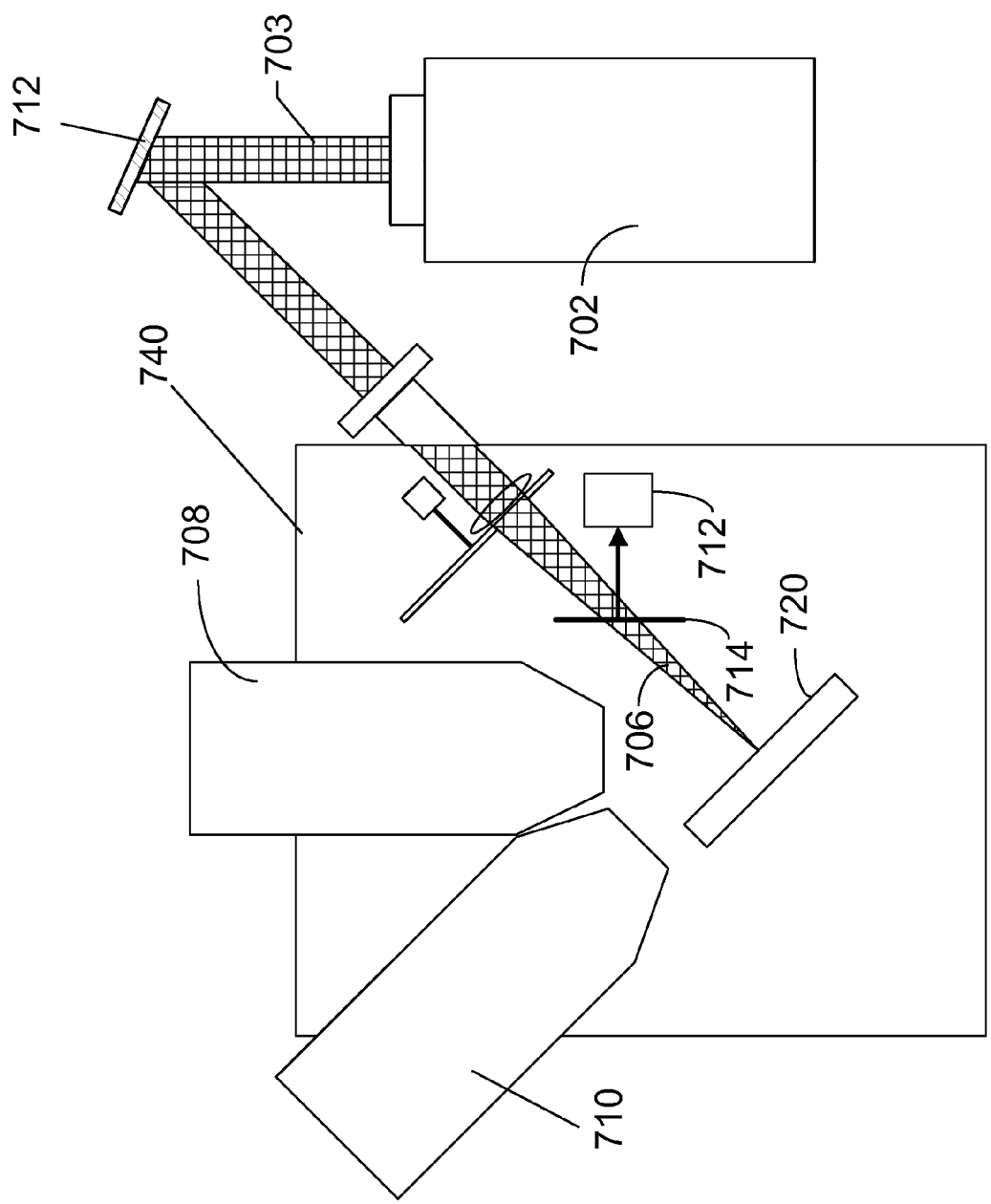
FIG. 7 is a schematic view of one preferred embodiment of the invention in which a beam splitter and detector are used to determine when the transparent screen of the protective screen assembly should be moved or replaced to maintain a clean portion of the transparent screen covering the objective lens according to a preferred embodiment of the present invention.

Yet another embodiment of the invention is illustrated in FIG. 7. In the preferred embodiment of FIG. 7, a beam splitter 714 is placed in the path of the focused laser beam 706 within the vacuum chamber where it splits off a small portion of the laser light (for example ~10%) and directs that portion to a detector 712. The intensity of the laser beam can be measured by the detector and when it falls below a certain threshold, this can be an indicator that the protective screen assembly should be moved so that a clean portion of the transparent screen covers the objective lens or else should be replaced. In some preferred embodiments, the transparent screen can be moved (for example, rotated or unrolled) automatically when the pre-set threshold is reached. Although a small percentage of the laser beam output will be lost to the beam splitter, in most cases the output of the laser can be increased slightly to make up for the split beam. Alternatively, as shown in FIG. 6, a detector can 614 be mounted on a moveable or retractable arm and moved into the focused beam path periodically to measure the laser beam intensity.

Although the description of the present invention above is mainly directed at an apparatus, it should be recognized that a method of using the claimed apparatus would further be within the scope of the present invention. Further, it should be recognized that embodiments of the present invention can be implemented via computer hardware or software, or a combination of both. The methods can be implemented in computer programs using standard programming techniques—including a computer-readable storage medium configured with a computer program, where the storage medium so configured causes a computer to operate in a specific and pre-defined manner—according to the methods and figures described in this Specification. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits programmed for that purpose.

Further, methodologies may be implemented in any type of computing platform, including but not limited to, personal computers, mini-computers, main-frames, workstations, networked or distributed computing environments, computer platforms separate, integral to, or in communication with charged particle tools or other imaging devices, and the like. Aspects of the present invention may be implemented in machine readable code stored on a storage medium or device, whether removable or integral to the computing platform, such as a hard disc, optical read and/or write storage mediums, RAM, ROM, and the like, so that it is readable by a programmable computer, for configuring and operating the computer when the storage media or device is read by the computer to perform the procedures described herein. Moreover, machine-readable code, or portions thereof, may be transmitted over a wired or wireless network. The invention described herein includes these and other various types of computer-readable storage media when such media contain instructions or programs for implementing the steps described above in conjunction with a microprocessor or other data processor. The invention also includes the computer itself when programmed according to the methods and techniques described herein.

Computer programs can be applied to input data to perform the functions described herein and thereby transform the input data to generate output data. The output information is applied to one or more output devices such as a display monitor. In preferred embodiments of the present invention, the transformed data represents physical and tangible objects, including producing a particular visual depiction of the physical and tangible objects on a display.

The invention has broad applicability and can provide many benefits as described and shown in the examples above. The embodiments will vary greatly depending upon the specific application, and not every embodiment will provide all of the benefits and meet all of the objectives that are achievable by the invention.

In the following discussion and in the claims, the terms "including" and "comprising" are used in an open-ended fashion, and thus should be interpreted to mean "including, but not limited to . . . ". The term "charged particle beam" is used herein to refer to any electron beam or any collimated ion beam, including a beam focused by ion optics and shaped ion beams. The term "Dual Beam" is used herein to refer to any combination system including two beams for sample processing, including a combination FIB/SEM or a charged particle beam coincident to or in the vicinity of a laser beam. To the extent that any term is not specially defined in this specification, the intent is that the term is to be given its plain and ordinary meaning. The accompanying drawings are intended to aid in understanding the present invention and, unless otherwise indicated, are not drawn to scale.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

I claim:

1. A combined laser/charged particle beam system, comprising:
    a vacuum chamber;
    a charged particle beam column for processing a sample in the vacuum chamber;
    a laser assembly for performing laser ablation in the vacuum chamber, the laser assembly having:
        a laser light source, the laser light source being a source of a nanosecond to femtosecond, pulsed laser beam, and
        focusing optics for producing a focused laser beam from the laser light source, the focusing optics including an objective lens for focusing the laser beam onto the sample within the vacuum chamber; and
    a replaceable protective screen formed from a transparent conductive material, the replaceable protective screen placed between the sample and the objective lens so that the focused laser beam passes through the transparent conductive material of the replaceable protective screen and so that debris ejected toward the objective lens during laser ablation of the sample strikes the replaceable protective screen.

2. The combined laser/charged particle beam system of claim 1 in which the replaceable protective screen can be replaced without breaking vacuum in the sample chamber.

3. The combined laser/charged particle beam system of claim 1 in which the replaceable protective screen can be repositioned so that when the passage of the laser light through the portion of the replaceable protective screen covering the objective lens becomes occluded beyond a predetermined threshold, the replaceable protective screen can be repositioned so that a non-occluded portion of the replaceable protective screen covers the objective lens.

4. The combined laser/charged particle beam system of claim 3 in which the replaceable protective screen can be repositioned without breaking vacuum in the sample chamber.

5. The combined laser/charged particle beam system of claim 2 in which the transparent conductive material comprises a nonconductive material coated with a layer of a transparent conductor.

6. The combined laser/charged particle beam system of claim 5 in which the nonconductive material comprises glass and the transparent conductor comprises indium tin oxide or fluorine doped tin oxide.

7. The combined laser/charged particle beam system of claim 2 in which the transparent conductive material comprises graphene, doped zinc oxide, Poly 3,4-ethylenedioxythiophene (PEDOT), PEDOT:Polystrene sulfonate (PEDOT:PSS), or Poly(4,4-dioctylcyclopentadithiophene), or a polymer based film.

8. The combined laser/charged particle beam system of claim 5 in which the nonconductive material comprises an optical flat.

9. The combined laser/charged particle beam system of claim 1 in which the area covered by the replaceable protective screen is larger than area of the objective lens and further comprising a shield covering at least a portion of transparent screen not covering the objective lens.

10. The combined laser/charged particle beam system of claim 9 in which the replaceable protective screen is rotatable so that when the portion of the transparent screen covering the objective lens is occluded by debris, the replaceable protective screen can be rotated so that a non-occluded portion of the transparent screen formerly covered by the shield is positioned to cover the objective lens.

11. The combined laser/charged particle beam system of claim 1 in which the transparent conductive material of the replaceable protective screen has a surface area that is larger than the objective lens and in which the replaceable protective screen comprises a roll of flexible transparent material that can be scrolled between the objective lens and the sample surface.

12. The combined laser/charged particle beam system of claim 11 in which the replaceable protective screen can be scrolled across the objective lens so that when the portion of the transparent screen covering the objective lens is occluded by debris, a non-occluded portion of the transparent screen can be unrolled and positioned to cover the objective lens.

13. The combined laser/charged particle beam system of claim 1 in which the objective lens and the replaceable protective screen are both positioned inside the vacuum chamber.

14. The combined laser/charged particle beam system of claim 1 in which laser objective lens is located outside the vacuum chamber and the laser is focused onto the sample through a transparent window in the vacuum chamber wall and in which the replaceable protective screen is located inside the vacuum chamber and protects the transparent window from debris ejected during laser ablation.

15. The combined laser/charged particle beam system of claim 1 further comprising a detector located within vacuum chamber to measure the intensity of the focused laser beam.

16. The combined laser/charged particle beam system of claim 15 further comprising a beam splitter positioned in the path of the focused laser beam to direct a portion of the laser light toward the detector.

17. The combined laser/charged particle beam system of claim 15 in which the detector can be moved into the path of the focused laser beam for measurement and out of the path of the focused laser beam for sample processing.

18. A method of protecting optical components during laser ablation of a sample in a vacuum chamber of a combined laser/charged particle beam system, the method comprising:
    placing a transparent conductive material between the sample and the optical components of a laser;
    ablating the sample used a focused laser beam, the focused laser beam passing through the transparent conductive material and the transparent conductive material serving to block debris ejected during laser ablation from reaching the optical components of the laser;
    imaging the sample using a charged particle beam in order to monitor the laser ablation process; and
    when a buildup of debris on the transparent conductive material becomes sufficient to occlude the laser, replacing the occluded transparent conductive material with non-occluded transparent conductive material without breaking vacuum in the vacuum chamber.

19. The method of claim 18 further comprising using a laser detector to quantify the ablating laser to determine when the occluded transparent conductive material should be replaced.

20. The method of claim 18, further comprising generating and collimating a charged particle beam to strike the sample in the vacuum chamber, the transparent conductive coating counteracting charging effects that would otherwise degrade the performance of the charged particle beam.

\* \* \* \* \*